(12) United States Patent
Fan (10) Patent No.: US 10,275,060 B2
(45) Date of Patent: Apr. 30, 2019

(54) TOUCH DISPLAY PANEL, METHOD FOR MANUFACTURING TOUCH DISPLAY PANEL, AND TOUCH PANEL DISPLAY

(71) Applicant: Shenzhen China Star Optoelectronics Technology Co., Ltd., Shenzhen, Guangdong (CN)

(72) Inventor: Yong Fan, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 228 days.

(21) Appl. No.: 15/038,505

(22) PCT Filed: Apr. 25, 2016

(86) PCT No.: PCT/CN2016/080151
§ 371 (c)(1),
(2) Date: May 23, 2016

(87) PCT Pub. No.: WO2017/173679
PCT Pub. Date: Oct. 12, 2017

(65) Prior Publication Data
US 2018/0101267 A1     Apr. 12, 2018

(30) Foreign Application Priority Data

Apr. 6, 2016   (CN) .......................... 2016 1 0210394

(51) Int. Cl.
*G06F 3/041*        (2006.01)
*H01L 51/50*       (2006.01)
(Continued)

(52) U.S. Cl.
CPC .......... *G06F 3/0412* (2013.01); *G06F 3/0416* (2013.01); *H01L 27/32* (2013.01);
(Continued)

(58) Field of Classification Search
CPC ................. G06F 3/0412; G06F 3/0416; G06F 2203/04103
See application file for complete search history.

(56) References Cited

U.S. PATENT DOCUMENTS 9,484,468 B2 * 11/2016 Zhang ................. H01L 27/1225
9,715,247 B2 *  7/2017 Ozyilmaz ............. H01L 41/193
(Continued)

FOREIGN PATENT DOCUMENTS

CN         103236295 A      8/2013
CN         104124348 A     10/2014
(Continued)

OTHER PUBLICATIONS

Wang Xiaomu, A spectrally tunable all-graphene-based flexible field-effect light-emitting device, Nature Communications, Jul. 15, 2015, DOI: 10.1038/ncomms8767.

*Primary Examiner* — Afroza Chowdhury
(74) *Attorney, Agent, or Firm* — Andrew C. Cheng (57) ABSTRACT

The present disclosure proposes a touch display panel, a method for manufacturing touch display panel, and a touch panel display. The touch display panel includes an upper substrate, a lower substrate, a display element layer arranged between the upper substrate and the lower substrate, a first insulating layer, and a transparent touch electrode layer. The display element layer is arranged on the lower substrate for showing images. The first insulating layer is arranged on the display element layer for separating the display element layer from the transparent touch electrode layer. The transparent touch electrode layer is arranged on the first insulating layer for detecting the points where users touch, and the transparent touch electrode layer is fabricated from transparent and conductive graphene. The touch display panel
(Continued)

proposed by the present invention is simplified and optimized with lower production costs.

10 Claims, 5 Drawing Sheets

(51) Int. Cl.
    *H01L 51/00*     (2006.01)
    *H01L 27/32*     (2006.01)
    *H01L 51/05*     (2006.01)
    *H01L 51/10*     (2006.01)

(52) U.S. Cl.
    CPC ...... *H01L 51/0023* (2013.01); *H01L 51/0045* (2013.01); *H01L 51/50* (2013.01); *G06F 2203/04103* (2013.01); *H01L 51/055* (2013.01); *H01L 51/105* (2013.01)

(56) References Cited

U.S. PATENT DOCUMENTS

| | | | |
|---|---|---|---|
| 2013/0157022 A1* | 6/2013 | Kim | C03C 17/22 428/212 |
| 2013/0162549 A1 | 6/2013 | Kim et al. | |
| 2013/1062549 | 6/2013 | Kim et al. | |
| 2014/0210767 A1* | 7/2014 | Hur | G06F 3/0412 345/174 |
| 2015/0241908 A1* | 8/2015 | Ozyilmaz | H01L 41/193 345/174 |
| 2016/0027931 A1* | 1/2016 | Zhang | H01L 27/1225 257/43 |
| 2017/0294516 A1 | 10/2017 | Zhang et al. | |

FOREIGN PATENT DOCUMENTS

| | | |
|---|---|---|
| CN | 104966790 A | 10/2015 |
| CN | 105304495 A | 2/2016 |
| CN | 205121521 U | 3/2016 |

\* cited by examiner

TOUCH DISPLAY PANEL, METHOD FOR MANUFACTURING TOUCH DISPLAY PANEL, AND TOUCH PANEL DISPLAY

BACKGROUND OF THE INVENTION

1. Field of the Invention

The present invention is related to the field of touch panel display, and more particularly, to a touch display panel, a method for manufacturing the touch display panel, and a touch panel display.

2. Description of the Prior Art

Graphene has features of a solid texture, high transparency (the rate of transmittance ≈97.7%), high heat transfer coefficient (up to 5300 W/m·K), high electron mobility (over 15000 cm2/V·s). Owing to these features, graphene is increasingly applied to displays, especially in touch screens (replacing transparent conductive thin films, such as indium tin oxide (ITO)) and light-emitting diodes (LED).

A surge of graphene luminous components expands the application of graphene in the field of display. Color of light emitted by LEDs in luminous components fabricated from graphene is adjusted by regulating gate voltage.

A touch panel and a display screen are bonded to form a conventional display screen with the function of touch. The touch panel detects the points where users touch. The touch points are connected to the display contents through external circuitry. The touch control on the display content is realized after the operating system processes. The drawbacks of the cohesion of the touch panel and the display with the function of touch are as follows: (1) A lot of manufacturing processes and components are needed. (2) Transmittance of visible light is lowered due to an addition of the touch panel to the surface of the display panel. (3) The cohesion of the touch panel and the display panel causes a problem that bubbles easily appear on the interface between the bonded touch panel and display panel when the area of the display screen is large, and accordingly, the touch screen becomes defective, the yield rate decreases, and costs of the components increases.

SUMMARY OF THE INVENTION

The present invention proposes a touch display panel, a method for manufacturing the touch display panel, and a touch panel display for resolving the problems that the structure of a conventional touch display panel is complex and that costs of a conventional touch display panel is high.

According to the present invention, a touch display panel comprises an upper substrate, a lower substrate, a display element layer arranged between the upper substrate and the lower substrate, a first insulating layer, and a transparent touch electrode layer. The display element layer is arranged on the lower substrate for showing images. The first insulating layer is arranged on the display element layer for separating the display element layer from the transparent touch electrode layer. The transparent touch electrode layer is arranged on the first insulating layer for detecting the points where users touch, and the transparent touch electrode layer is fabricated from transparent and conductive graphene.

In one aspect of the present invention, the display element layer comprises a plurality of thin-film transistor (TFT) items. The TFT item comprises a source/drain pattern layer, a luminous layer, a second insulating layer, and a gate pattern layer; the luminous layer is disposed below the source/drain pattern layer. The second insulating layer is disposed below the luminous layer; the second insulating layer separates the luminous layer from the gate pattern layer situated under the luminous layer. The luminous layer is fabricated from reduced graphene oxide.

In another aspect of the present invention, the source/drain pattern layer and the gate pattern layer are fabricated from the reduced graphene oxide.

According to the present invention, a touch panel display comprises a touch display panel. The touch display panel comprises an upper substrate, a lower substrate, a display element layer arranged between the upper substrate and the lower substrate, a first insulating layer, and a transparent touch electrode layer. The display element layer is arranged on the lower substrate for showing images. The first insulating layer is arranged on the display element layer for separating the display element layer from the transparent touch electrode layer. The transparent touch electrode layer is arranged on the first insulating layer for detecting the points where users touch, and the transparent touch electrode layer is fabricated from transparent and conductive graphene.

In one aspect of the present invention, the display element layer comprises a plurality of thin-film transistor (TFT) items. The TFT item comprises a source/drain pattern layer, a luminous layer, a second insulating layer, and a gate pattern layer; the luminous layer is disposed below the source/drain pattern layer. The second insulating layer is disposed below the luminous layer; the second insulating layer separates the luminous layer from the gate pattern layer situated under the luminous layer. The luminous layer is fabricated from reduced graphene oxide.

In another aspect of the present invention, the source/drain pattern layer and the gate pattern layer are fabricated from the reduced graphene oxide.

According to the present invention, a method for manufacturing a touch display panel comprises: forming a transparent touch electrode layer on an upper substrate wherein the transparent touch electrode layer is fabricated from transparent and conductive graphene; forming a first insulating layer on the transparent touch electrode layer; form a display element layer on the first insulating layer; and covering the display element layer with the lower substrate.

In one aspect of the present invention, the step of forming a transparent touch electrode layer on an upper substrate comprises steps of: spraying or printing graphene oxide on the substrate; solidifying the graphene oxide; and patterning the solidified graphene oxide to form the transparent touch electrode layer.

In another aspect of the present invention, the step of patterning the solidified graphene oxide to form the transparent touch electrode layer comprises steps of: patterning the graphene oxide by means of laser shining, and meanwhile, reducing the graphene oxide.

In another aspect of the present invention, the step of forming a display element layer on the first insulating layer comprises steps of: forming a source/drain pattern layer on the first insulating layer; forming a luminous layer on the source/drain pattern layer; forming the second insulating layer on the luminous layer; and forming a gate pattern layer on the second insulating layer.

In another aspect of the present invention, the step of forming a source/drain pattern layer on the first insulating layer comprises steps of: spraying or printing source/drain graphene oxide on the first insulating layer; solidifying a source/drain graphene oxide layer; patterning the solidified source/drain graphene oxide by means of laser shining, and reducing the source/drain graphene oxide to form the source/ drain pattern layer. The step of forming a luminous layer on the source/drain pattern layer comprises steps of: spraying or printing luminous semiconductor graphene oxide on the source/drain pattern layer; solidifying the luminous semiconductor graphene oxide; and patterning the solidified luminous semiconductor graphene oxide by means of laser shining, and meanwhile, reducing the luminous semiconductor graphene oxide to form the luminous layer.

In another aspect of the present invention, the step of forming the gate pattern layer on the second insulating layer comprises steps of: spraying or printing gate graphene oxide on the second insulating layer; patterning the solidified gate graphene oxide by means of laser shining to form the gate pattern layer; or forming the gate metallic layer on the second insulating layer; patterning the metallic layer by means of etching to form the gate pattern layer.

Compared with conventional technology, a transparent touch electrode with the function of touch is arranged on a display element layer in the display panel in the present invention so that the display panel has the function of touch. Since the display panel has the function of touch, it is unnecessary to add a touch panel on the display panel. Therefore, both of the processes and the number of components are reduced. It is unnecessary to worry about a decrease in visible light transparency because of the touch panel and a low yield rate because of the cohesion of the display panel and the touch panel. To sum up, the touch display panel proposed by the present invention is simplified and optimized with lower production costs.

DETAILED DESCRIPTION OF THE PREFERRED EMBODIMENTS

The accompanying drawings are included to provide a further understanding of the invention, and are incorporated in and constitute a part of this specification. The drawings illustrate embodiments of the invention and, together with the description, serve to explain the principles of the invention.

Figure 1:
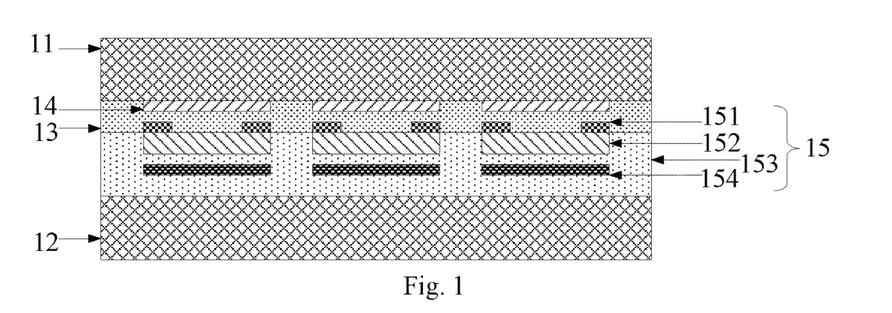
FIG. 1 shows a schematic diagram of the structure of a touch display panel according to one preferred embodiment of the present invention.

Please refer to FIG. 1 showing a schematic diagram of the structure of a touch display panel 21 according to one preferred embodiment of the present invention.

The touch display panel 21 comprises an upper substrate 11, a lower substrate 12, a display element layer arranged between the upper substrate 11 and the lower substrate 12, a first insulating layer 13, and a transparent touch electrode layer 14.

Preferably, the upper substrate 11 and the lower substrate 12 are fabricated from water- and oxygen-resistant transparent organic material such as polyethylene terephthalate (PET). Otherwise, the upper substrate 11 and the lower substrate 12 are fabricated from glass, nickel (Ni), etc. The upper substrate 11 and the lower substrate 12 are the support and the protection of the display element layer, the first insulating layer 13, the transparent touch electrode layer 14, and so on.

The display element layer is arranged on the lower substrate 12 and used for showing images.

The first insulating layer 13 is arranged on the display element layer and used for separating the display element layer from the transparent touch electrode layer 14. The first insulating layer 13 may be a polyimide (PI) layer and formed on the display element layer by means of spray.

The transparent touch electrode layer 14 is arranged on the first insulating layer 13 and used for detecting the points where users touch. The transparent touch electrode layer 14 is fabricated from transparent and conductive graphene. The transparent and conductive graphene is reduced graphene oxide.

The touch display panel further comprises a control circuit (not shown in the figures). The control circuit is used for connecting the touched points detected by the transparent touch electrode layer 14 to the display content of the display element layer. The touch control on the display content is realized after the operating system processes.

Compared with conventional technology, the transparent touch electrode 14 with the function of touch is arranged on a display element layer in the display panel in the present invention so that the display panel has the function of touch. Since the display panel has the function of touch, it is unnecessary to add a touch panel on the display panel. Therefore, both of the processes and the number of components are reduced. It is unnecessary to worry about a decrease in visible light transparency because of the touch panel and a low yield rate because of the cohesion of the display panel and the touch panel. Therefore, the touch display panel proposed by the present invention is simplified and optimized with lower production costs.

The display element layer comprises a plurality of thin-film transistor (TFT) items 15. A TFT item 15 comprises a source/drain pattern layer 151, a luminous layer 152, a second insulating layer 153, and a gate pattern layer 154. The luminous layer 152 is disposed below the source/drain pattern layer 151. The second insulating layer 153 is disposed below the luminous layer 152. The second insulating layer 153 is used for separating the luminous layer 152 from the gate pattern layer 154. The gate pattern layer 154 is situated below the luminous layer 152 with the second insulating layer 153 inserted between the two.

The luminous layer 152, the source/drain pattern layer 151, and the gate pattern layer 153 are fabricated from reduced graphene oxide. The gate pattern layer 153 can also be fabricated from metal such as high reflection metal (HRM). Because of different levels of gate voltage, the pixel section is divided into red (R) pixel, green (G) pixel, and blue (B) pixel. The RGB pixels are divided by the insulating layer $SiO_2$.

Figure 2:
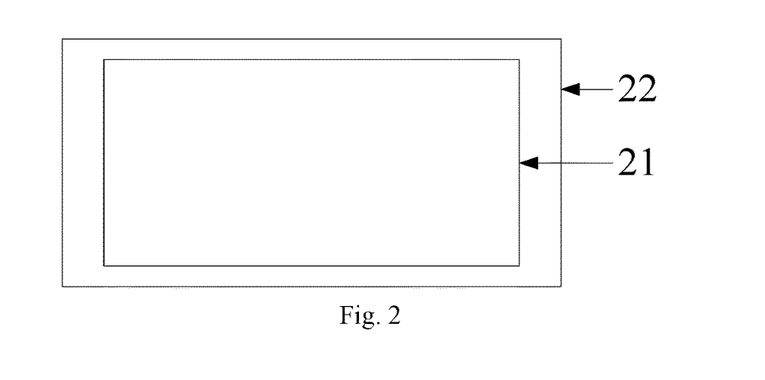
FIG. 2 is a schematic diagram of the touch panel display according to the preferred embodiment of the present invention.

The present invention further proposes a touch panel display. The touch panel display comprises the touch display panel 21 and a frame 22 as shown in FIG. 2. FIG. 2 is a schematic diagram of the touch panel display according to the preferred embodiment of the present invention. The touch panel display has a simple and optimal structure. Also, production costs of the touch panel display are comparably low.

Figure 3:
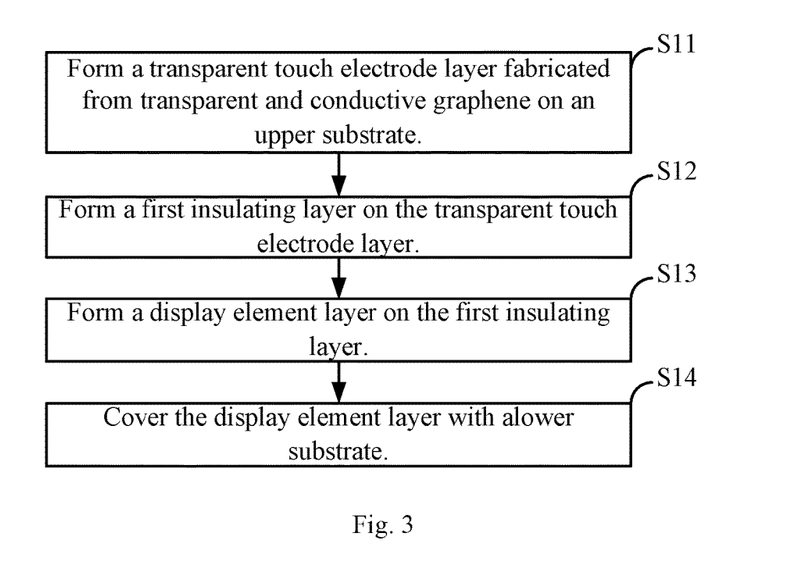
FIG. 3 shows a flowchart of the method according to the first embodiment of the present invention.

The present invention further proposes a method for manufacturing for the above-mentioned touch display panel. Please refer to FIG. 3 showing a flowchart of the method according to the first embodiment of the present invention.

The method for manufacturing the touch display panel comprises following steps:

Step S11: Form a transparent touch electrode layer fabricated from transparent and conductive graphene on an upper substrate.

The upper substrate is fabricated from polyethylene terephthalate (PET), glass, or nickel (Ni). The upper substrate is used for supporting and protecting the transparent touch electrode layer. Specifically, the transparent touch electrode layer is fabricated from transparent and conductive reduced graphene oxide. The transparent touch electrode layer is used for detecting the points where the users touch.

Step S12: Form a first insulating layer on the transparent touch electrode layer.

The first insulating layer formed in Step S12 is used for transforming the transparent touch electrode layer into a display element layer subsequently. The first insulating layer may be a polyimide (PI) layer.

Step S13: Form a display element layer on the first insulating layer.

The display element layer is used for showing images. The display content of the display element layer is connected to the touched points detected by the transparent touch electrode layer through the control circuit. Also, the touch control on the display content is realized after the operating system processes.

Step S14: Cover the display element layer with a lower substrate.

After the lower substrate covers the display element layer, the display element layer, the transparent touch electrode layer, and the first insulating layer are arranged between the upper substrate and the lower substrate. Such an arrangement makes the display element layer, the transparent touch electrode layer, and the first insulating layer well protected with the upper substrate and the lower substrate.

The preparation method for the touch display panel is technically simple with lower production costs. The structure of the prepared touch display panel is also optimal.

Figure 4:
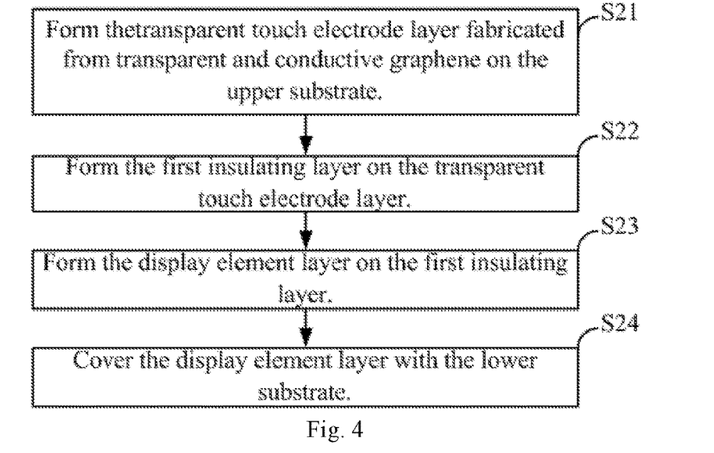
FIG. 4 is a flowchart of a method for manufacturing for a touch display panel according to a second embodiment of the present invention.
Figure 5:
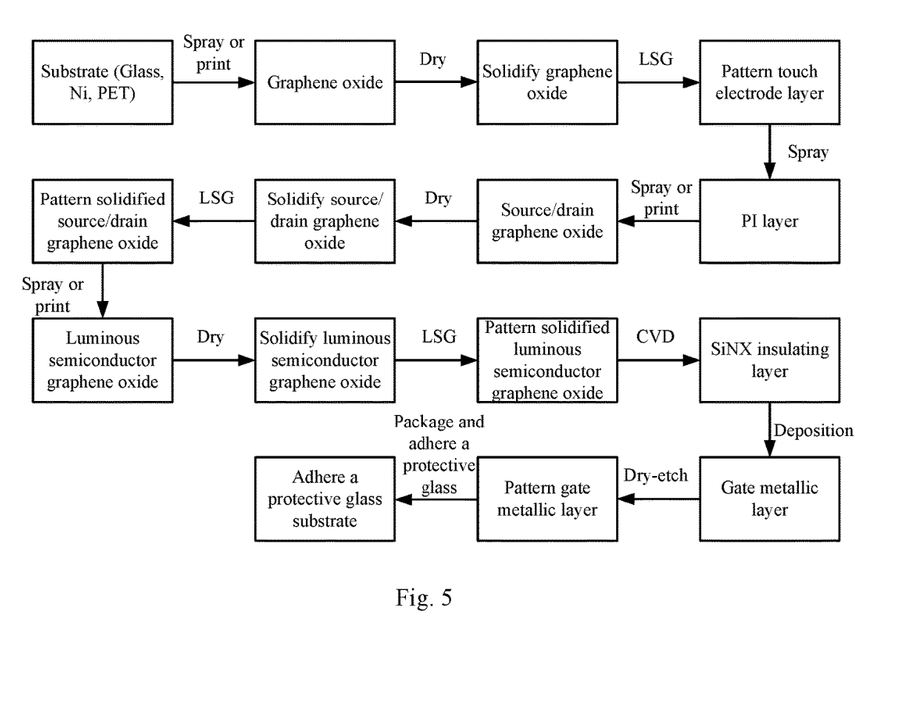
FIG. 5 is a flowchart of the method for manufacturing the touch display panel according to the second embodiment of the present invention.

Please refer to FIG. 4 and FIG. 5. FIG. 4 is a flowchart of a method for manufacturing for a touch display panel according to a second embodiment of the present invention. FIG. 5 is a flowchart of the method for manufacturing the touch display panel according to the second embodiment of the present invention.

Step S21: Form the transparent touch electrode layer fabricated from transparent and conductive graphene on the upper substrate.

Figure 6:
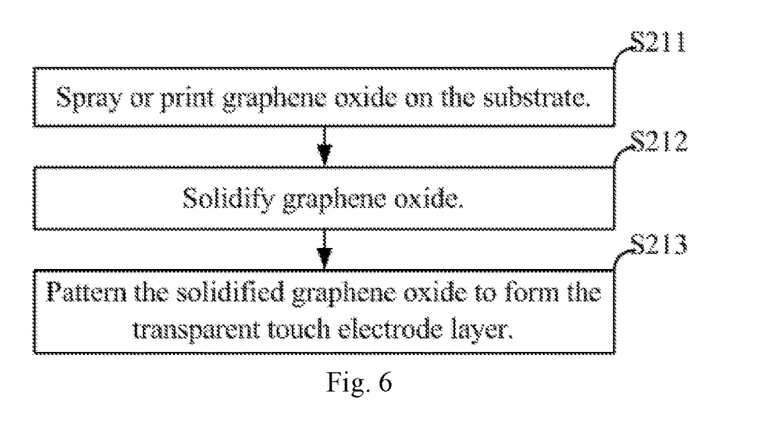
FIG. 6 shows a flowchart of Step S21 as shown in FIG. 4.

Please refer to FIG. 6 showing a flowchart of Step S21 as shown in FIG. 4. Step S21 comprises following steps:

Step S211: Spray or print graphene oxide on the substrate.

The thickness of the sprayed or printed graphene oxide ranges from dozens of nanometers to hundreds of nanometers.

Step S212: Solidify graphene oxide.

In Step S212, the generated graphene oxide thin film contains water at this time. To solidify the thin film, nitrogen passes through the surface of the thin film to make water and nitrogen in the thin film disappear.

Step S213: Pattern the solidified graphene oxide to form the transparent touch electrode layer.

In step S213, the method of laser shining is known as laser scribing graphene (LSG) technique. Graphene oxide is patterned and reduced by means of laser shining. The wavelength of laser is between 700 nm and 800 nm. The duration of laser shining decides the degree of reduction of graphene oxide. Graphene oxide is an insulator and a non-conductor. After graphene oxide is shone with laser, reduced graphene oxide is formed. So reduced graphene oxide is conductive. After graphene oxide covered by a mask is shone with laser, graphene oxide is patterned and the transparent touch electrode layer is formed.

Step S22: Form the first insulating layer on the transparent touch electrode layer.

Specifically, the PI layer is by means of spray.

Step S23: Form the display element layer on the first insulating layer.

Figure 7:
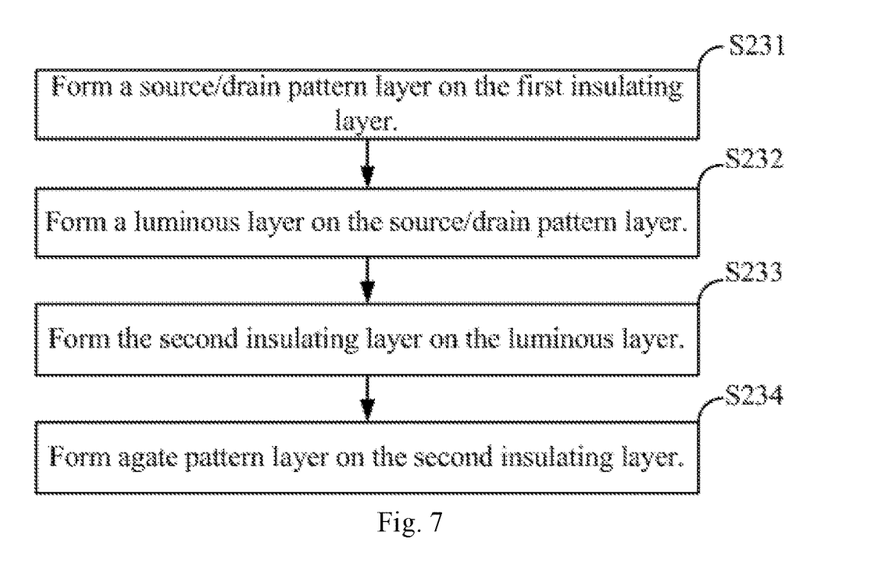
FIG. 7 shows a flowchart of Step S23 as shown in FIG. 4.

Please refer to FIG. 7 showing a flowchart of Step S23 as shown in FIG. 4.

Step S23 comprises a step:

Step S231: Form a source/drain pattern layer on the first insulating layer.

Figure 8:
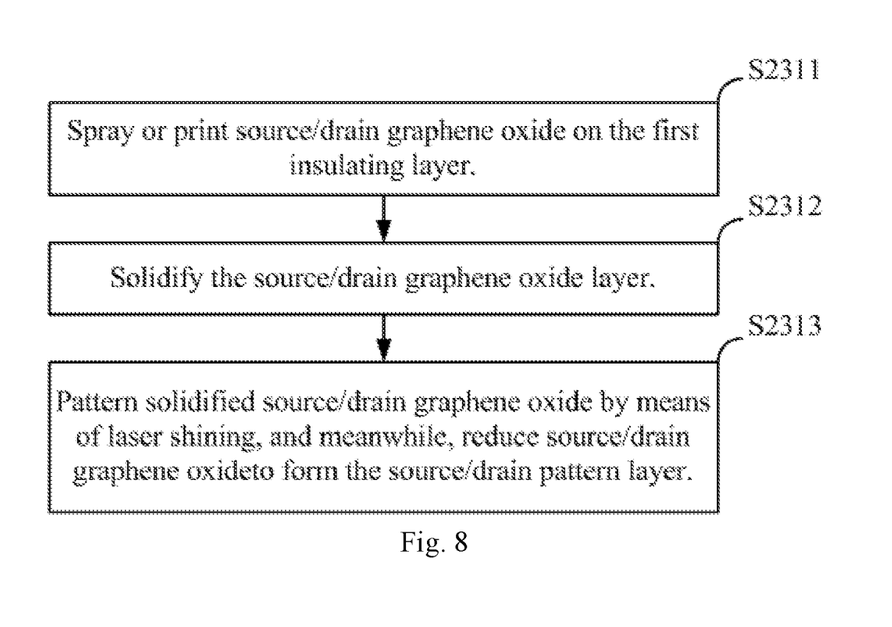
FIG. 8 shows a flowchart of Step S231 as shown in FIG. 7.

Please refer to FIG. 8 showing a flowchart of Step S231 as shown in FIG. 7. Step S231 further comprises following steps:

Step S2311: Spray or print source/drain graphene oxide on the first insulating layer.

Step S2312: Solidify the source/drain graphene oxide layer.

In Step S2312, the prepared graphene oxide thin film contains water at this time. To solidify the thin film, nitrogen passes through the surface of the thin film to make water and nitrogen in the thin film disappear.

Step S2313: Pattern solidified source/drain graphene oxide by means of laser shining, and meanwhile, reduce source/drain graphene oxide to form the source/drain pattern layer.

In Step S2313, graphene oxide is reduced with the LSG technique so the formed reduced graphene oxide is conductive. Also, after graphene oxide with the mask is shone with laser, graphene oxide is patterned and the source/drain pattern layer is formed.

Step S232: Form a luminous layer on the source/drain pattern layer.

Figure 9:
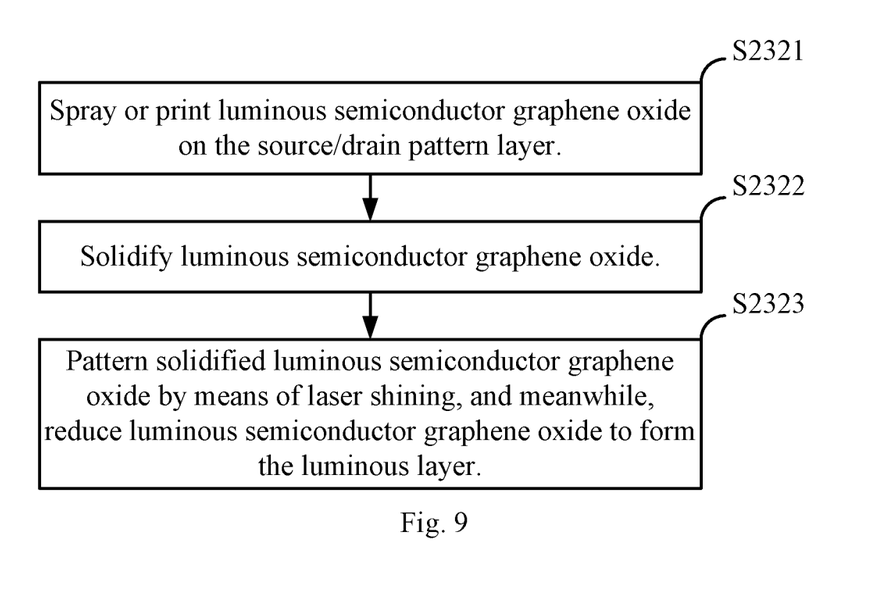
FIG. 9 shows a flowchart of Step S232 as shown in FIG. 7.

Please refer to FIG. 9 showing a flowchart of Step S232 as shown in FIG. 7. Specifically, Step S232 comprises following steps:

Step S2321: Spray or print luminous semiconductor graphene oxide on the source/drain pattern layer.

Step S2322: Solidify luminous semiconductor graphene oxide.

The prepared graphene oxide thin film contains water at this time. To solidify the thin film, nitrogen passes through the surface of the thin film to make water and nitrogen in the thin film disappear.

Step S2323: Pattern solidified luminous semiconductor graphene oxide by means of laser shining, and meanwhile, reduce luminous semiconductor graphene oxide to form the luminous layer.

Semiconductor graphene oxide is reduced with the LSG technique so the formed reduced graphene oxide is conductive. Also, after graphene oxide covered by the mask is shone with laser, graphene oxide is patterned and the luminous layer is formed.

Step S233: Form the second insulating layer on the luminous layer.

In Step S233, the second insulating layer may be a SiNX insulating layer and be formed with the method of chemical vapor deposition (CVD).

Step S234: Form a gate pattern layer on the second insulating layer.

Figure 10:
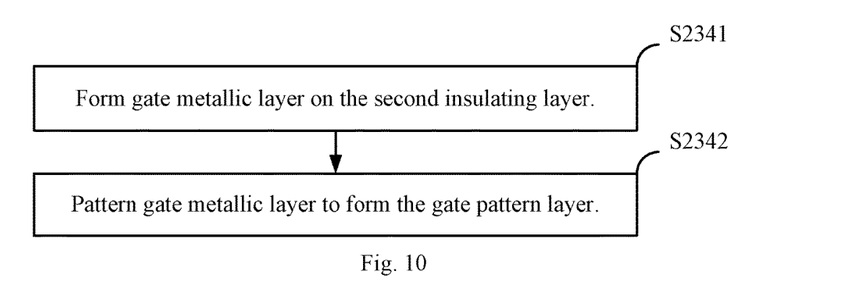
FIG. 10 shows a flowchart of Step S234 as shown in FIG. 7.

Specifically, refer to FIG. 10 showing a flowchart of Step S234 as shown in FIG. 7.

Step S2341: Form the gate metallic layer on the second insulating layer.

In Step S2341, the gate metallic layer may be high reflection metal (HRM) and may be formed on the second insulating layer with the method of deposition.

Step S2342: Pattern the gate metallic layer to form the gate pattern layer.

In Step S2342, the method of etching, such as dry-etching, is used to pattern the gate metallic layer. In another embodiment, graphene oxide is sprayed or printed on the second insulating layer and graphene oxide is reduced with the LSG technique to pattern the gate metallic layer.

Step S24: Cover the display element layer with the lower substrate.

To sum up, the present invention makes it come true that the touch display panel is simplified and optimized with technically simple processes and low production costs.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A touch display panel, comprising an upper substrate, a lower substrate, a display element layer arranged between the upper substrate and the lower substrate, a first insulating layer, and a transparent touch electrode layer, wherein the display element layer is arranged on the lower substrate for showing images;

the first insulating layer is directly arranged on the display element layer and to a surface of the upper substrate for separating the display element layer from the transparent touch electrode layer; and the transparent touch electrode layer is arranged on the first insulating layer for detecting the points where users touch, and the transparent touch electrode layer is fabricated from transparent and conductive graphene;

wherein the display element layer comprises a plurality of thin-film transistor (TFT) items; the TFT item comprises a source/drain pattern layer, a luminous layer, a second insulating layer, and a gate pattern layer; the luminous layer, the source/drain pattern layer and the gate pattern layer are fabricated from the reduced graphene oxide.

2. The touch display panel of claim 1, wherein the luminous layer is disposed below the source/drain pattern layer; the second insulating layer is disposed below the luminous layer; and the second insulating layer separates the luminous layer from the gate pattern layer situated correspondingly under the luminous layer.

3. A touch panel display, comprising: a touch display panel, comprising an upper substrate, a lower substrate, a display element layer arranged between the upper substrate and the lower substrate, a first insulating layer, and a transparent touch electrode layer, wherein the display element layer is arranged on the lower substrate for showing images;

the first insulating layer is directly arranged on the display element layer and to a surface of the upper substrate for separating the display element layer from the transparent touch electrode layer; and the transparent touch electrode layer is arranged on the first insulating layer for detecting the points where users touch, and the transparent touch electrode layer is fabricated from transparent and conductive graphene; and wherein the display element layer comprises a plurality of thin-film transistor (TFT) items; the TFT item comprises a source/drain pattern layer, a luminous layer, a second insulating layer, and a gate pattern layer; the luminous layer, the source/drain pattern layer and the gate pattern layer are fabricated from the reduced graphene oxide.

4. The touch panel display of claim 3, wherein the luminous layer is disposed below the source/drain pattern layer; the second insulating layer is disposed below the luminous layer; and the second insulating layer separates the luminous layer from the gate pattern layer situated correspondingly under the luminous layer.

5. A method for manufacturing a touch display panel, comprising:

forming a transparent touch electrode layer on an upper substrate wherein the transparent touch electrode layer is fabricated from transparent and conductive graphene;

forming a first insulating layer on the transparent touch electrode layer;

forming a display element layer on the first insulating layer; and covering the display element layer with the lower substrate; wherein the display element layer comprises a source/drain pattern layer, a luminous layer, a second insulating layer, and a gate pattern layer; the luminous layer, the source/drain pattern layer and the gate pattern layer are fabricated from reduced graphene oxide.

6. The method of claim 5, wherein the step of forming a transparent touch electrode layer on an upper substrate comprises steps of:

spraying or printing graphene oxide on the substrate;

solidifying the graphene oxide; and patterning the solidified graphene oxide to form the transparent touch electrode layer.

7. The method of claim 6, wherein the step of patterning the solidified graphene oxide to form the transparent touch electrode layer comprises steps of: patterning the graphene oxide by means of laser shining, and meanwhile, reducing the graphene oxide.

8. The method of claim 7, wherein the step of forming a display element layer on the first insulating layer comprises steps of:

forming the source/drain pattern layer on the first insulating layer;

forming the luminous layer on the source/drain pattern layer;

forming the second insulating layer on the luminous layer; and forming the gate pattern layer on the second insulating layer.

9. The method of claim 8, wherein the step of forming a source/drain pattern layer on the first insulating layer comprises steps of:

spraying or printing source/drain graphene oxide on the first insulating layer;
solidifying a source/drain graphene oxide layer;
patterning the solidified source/drain graphene oxide by means of laser shining, and reducing the source/drain graphene oxide to form the source/drain pattern layer;
the step of forming a luminous layer on the source/drain pattern layer comprises steps of:
spraying or printing luminous semiconductor graphene oxide on the source/drain pattern layer;
solidifying the luminous semiconductor graphene oxide; and
patterning the solidified luminous semiconductor graphene oxide by means of laser shining, and meanwhile, reducing the luminous semiconductor graphene oxide to form the luminous layer.

10. The method of claim 9, wherein the step of forming the gate pattern layer on the second insulating layer comprises steps of:
spraying or printing gate graphene oxide on the second insulating layer;
patterning the solidified gate graphene oxide by means of laser shining to form the gate pattern layer; or
forming the gate metallic layer on the second insulating layer; and
patterning the metallic layer by means of etching to form the gate pattern layer.

* * * * *